(12) United States Patent
Wu

(10) Patent No.: US 9,865,348 B2
(45) Date of Patent: Jan. 9, 2018

(54) DEVICES AND METHODS FOR SELECTING A FORMING VOLTAGE FOR A RESISTIVE RANDOM-ACCESS MEMORY

(71) Applicant: Winbond Electronics Corp., Taichung (TW)

(72) Inventor: Chien-Min Wu, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 128 days.

(21) Appl. No.: 15/244,308

(22) Filed: Aug. 23, 2016

(65) Prior Publication Data

US 2017/0092356 A1 Mar. 30, 2017

(30) Foreign Application Priority Data

Sep. 30, 2015 (CN) .......................... 2015 1 0638568

(51) Int. Cl.
*G11C 13/00* (2006.01)
*G11C 29/44* (2006.01)
*G11C 29/00* (2006.01)

(52) U.S. Cl.
CPC ...... *G11C 13/0069* (2013.01); *G11C 29/4401* (2013.01); *G11C 29/70* (2013.01); *G11C 2013/0083* (2013.01)

(58) Field of Classification Search
CPC ............ G11C 13/0069; G11C 13/0038; G11C 29/4401; G11C 29/789
See application file for complete search history.

(56) References Cited

U.S. PATENT DOCUMENTS

| 7,835,173 | B2 * | 11/2010 | Ma .................... | G11C 13/0038 365/100 |
| 2013/0250657 | A1 * | 9/2013 | Haukness .......... | G11C 13/0069 365/148 |
| 2016/0078915 | A1 * | 3/2016 | Katayama .......... | G11C 11/1673 365/158 |

\* cited by examiner

*Primary Examiner* — Tri Hoang
(74) *Attorney, Agent, or Firm* — Muncy, Geissler, Olds & Lowe, P.C.

(57) ABSTRACT

A memory driving device and a method thereof applied for a RRAM array are provided. The memory driving device includes a voltage generator, a current detector, and a controller. The voltage generator generates a write voltage. An RRAM cell of the RRAM array is selected according to a selection signal for receiving the program voltage to generate a program current. The current detector detects the program current. The controller executes a driving procedure which includes: obtaining a voltage distribution for the program voltage; determining the initial voltage and the maximum voltage of the program voltage according to the voltage distribution; gradually increasing the program voltage from the initial voltage to the maximum voltage; determining whether the program current exceeds the reference current; and selecting another RRAM cell when the write current exceeds the reference current.

18 Claims, 6 Drawing Sheets

DEVICES AND METHODS FOR SELECTING A FORMING VOLTAGE FOR A RESISTIVE RANDOM-ACCESS MEMORY

CROSS REFERENCE TO RELATED APPLICATIONS

This Application claims priority of China Patent Application No. 201510638568.0, filed on Sep. 30, 2015, the entirety of which is incorporated by reference herein.

BACKGROUND OF THE INVENTION

Field of the Invention

The disclosure relates generally to devices and methods for driving a resistive random-access memory, and more particularly it relates to devices and methods of selecting a forming voltage for a resistive random-access memory.

Description of the Related Art

In integrated circuit (IC) devices, resistive random-access memory (RRAM) is an emerging technology for next-generation non-volatile memory devices. RRAM is a memory structure including an array of RRAM cells, each of which stores a bit of data according to resistance values, rather than electronic charge. In particular, each RRAM cell includes a resistive switching material layer, the resistance of which can be adjusted to represent logic "0" or logic "1." RRAM devices operate under the principle that a dielectric, which has high resistance, can be switched to have low resistance through a conductive filament or conductive path formed therein after performing a forming operation with a sufficiently high voltage. The sufficiently high voltage is the 'forming' voltage.

The conductive filament or path can be formed through different mechanisms, including defects, metal migration, and other mechanisms. Various dielectric materials may be used in RRAM devices. Once the conductive filament or path has been formed therein, the RRAM device may be reset by breaking the conductive filament or path so as to be in a high resistance state, or set by reforming the conductive filament or path with an appropriately bias voltage so as to be in a low resistance state.

Due to process variation, the forming voltage for each of the resistive random-access memory cells varies considerably. Therefore, applied with a constant forming voltage may cause irreversible harm to some resistive random-access memory cells. For precisely providing an appropriate forming voltage to each of the resistive random-access memory cells, an effective device and method for driving a resistive random-access memory is required.

BRIEF SUMMARY OF THE INVENTION

In an embodiment, a memory driving device for a resistive random-access memory array is provided. The resistive random-access memory array comprises a plurality of resistive random-access memory cells. The memory driving device comprises: a voltage generator, a current detector, and a controller. The voltage generator generates a program voltage, wherein one of the resistive random-access memory cells receives the program voltage to generate a program current. The current detector detects the program current. The controller executes a driving procedure, wherein the driving procedure comprises: executing a pilot-run procedure to obtain the voltage distribution of the program voltages; determining an initial voltage and a maximum voltage of the program voltage according to the voltage distribution; selecting one of the resistive random-access memory cells by a selection signal; applying the program voltage to the selected resistive random-access memory cell, wherein the program voltage ranges from the initial voltage to the maximum voltage; determining whether the program current exceeds a reference current; and when the program current exceeds the reference current, selecting another resistive random-access memory cell in the resistive random-access memory array by the selection signal.

According to an embodiment of the invention, the program voltage is gradually increased from the initial voltage and applied to the selected resistive random-access memory cell, wherein when the program current does not exceed the reference current, the driving procedure further comprises: increasing the program voltage; determining whether the program voltage exceeds the maximum voltage; when the program voltage does not exceed the maximum voltage, generating the increased program voltage and determining whether the program current exceeds the reference current; when the program voltage exceeds the maximum voltage, determining whether the number of measurements taken is less than a predetermined number of times, wherein the number of measurements taken is the number of times that a determination was made about whether the program current exceeds the reference current; when determining that the number of measurements taken is less than the predetermined number of times, generating the program voltage that is equal to the maximum voltage; and when determining that the number of measurements taken is not less than the predetermined number of times, performing a redundancy repair.

According to an embodiment of the invention, when the program current exceeds the reference current, the driving procedure further comprises: determining whether there is another resistive random-access memory cell that is unselected in the resistive random-access memory array; when there is another resistive random-access memory cell that is unselected in the resistive random-access memory array, selecting the other resistive random-access memory cell that is unselected by the selection signal; and applying the program voltage that is equal to the initial voltage to the another resistive random-access memory cell.

According to an embodiment of the invention, the pilot-run procedure comprises: the selection signal selects one of the resistive random-access memory cells; the voltage generator generates a program voltage and applies the program voltage to the selected resistive random-access memory cell, wherein the program voltage is a predetermined voltage; determining whether the program current exceeds the reference current; when the program current does not exceed the reference current, increasing the program voltage by a predetermined increment and determining whether the program voltage increased by the predetermined increment exceeds a reference voltage; and when the program voltage increased by the predetermined increment does not exceed the reference voltage, generating a program voltage increased by the predetermined increment and applying it to the selected resistive random-access memory cell.

According to an embodiment of the invention, the pilot-run procedure further comprises: when the program current exceeds the reference current, storing the program voltage corresponding to the program current in a register to form the voltage distribution; determining whether a number of measurements taken of the selected resistive random-access memory cells is less than a predetermined lot-size; when the number of measurements taken is less than the predetermined lot-size, selecting, by the selection signal, another resistive random-access memory cell that is unselected; when the number of measurements taken is not less than the predetermined lot-size, calculating the initial voltage and the maximum voltage by the program voltage stored in the register.

According to an embodiment of the invention, the memory driving device further comprises a pilot-run resistive random-access memory array, wherein the pilot-run resistive random-access memory array comprises a plurality of pilot-run resistive random-access memory cells, wherein the resistive random-access memory cells processed in the pilot-run procedure are selected from the pilot-run resistive random-access memory cells.

According to an embodiment of the invention, the voltage distribution comprises a mean and a standard deviation of the program voltage stored in a register, wherein the initial voltage is not less than the mean minus 0.5V and not greater than the mean plus 0.5V.

According to another embodiment of the invention, the voltage distribution comprises a mean and a standard deviation of the program voltage stored in a register, wherein the initial voltage is any voltage greater than 0V that is not less than the mean minus a predetermined multiplier of the standard deviation minus 0.3V and not greater than the mean plus 0.5V.

According to an embodiment of the invention, the maximum voltage is not less than the sum of the mean and a predetermined multiplier of the standard deviation and not greater than a sum of the mean, the predetermined multiplier of the standard deviation, and 0.5V.

In an embodiment, a memory driving method for selecting a resistive random-access memory cell in a resistive random-access memory array and applying a program voltage to the resistive random-access memory cell to generate a program current comprises: executing a pilot-run procedure to obtain a voltage distribution of the program voltages; determining an initial voltage and a maximum voltage of the program voltage according to the voltage distribution; selecting one of the resistive random-access memory cells; applying the program voltage to the selected resistive random-access memory cell, wherein the program voltage is between the initial voltage and the maximum voltage; determining whether the program current exceeds a reference current; and when the program current exceeds the reference current, selecting another resistive random-access memory cell.

According to an embodiment of the invention, the program voltage is gradually increased from the initial voltage and applied to the selected resistive random-access memory cell, wherein when the program current does not exceed the reference current, the driving procedure further comprises: increasing the program voltage; determining whether the program voltage exceeds the maximum voltage; generating the increased program voltage and determining whether the program current exceeds the reference current when the program voltage does not exceed the maximum voltage; determining whether the number of measurements taken is less than a predetermined number of times when the program voltage exceeds the maximum voltage, wherein the number of measurements taken is the number of times that a determination was made about whether the program current exceeds the reference current; generating the program voltage that is equal to the maximum voltage when determining that the number of measurements taken is less than the predetermined number of times; and performing a redundancy repair when determining that the number of measurements taken is not less than the predetermined number of times.

According to an embodiment of the invention, when the program current exceeds the reference current, the driving procedure further comprises: determining whether there is another resistive random-access memory cell that is unselected in the resistive random-access memory array; when there is another resistive random-access memory cell that is unselected in the resistive random-access memory array, selecting the other resistive random-access memory cell that is unselected; and generating the program voltage that is equal to the initial voltage.

According to an embodiment of the invention, the pilot-run procedure comprises: selecting one of the resistive random-access memory cells; applying the program voltage to the selected resistive random-access memory cell, wherein the program voltage is a predetermined voltage; determining whether the program current exceeds the reference current; when the program current does not exceed the reference current, increasing the program voltage by a predetermined increment and determining whether the program voltage increased by the predetermined increment exceeds a reference voltage; and when the program voltage increased by the predetermined increment does not exceed the reference voltage, generating the program voltage that is increased by the predetermined increment and applying the program voltage to the selected resistive random-access memory cell.

According to an embodiment of the invention, the pilot-run procedure further comprises: when the program current exceeds the reference current, storing the corresponding program voltage in a register to form the voltage distribution; determining that the number of measurements taken of the selected resistive random-access memory cells is less than a predetermined lot-size; when the number of measurements taken is less than the predetermined lot-size, selecting another resistive random-access memory cell by the selection signal; when the number of measurements taken is not less than the predetermined lot-size, calculating the initial voltage and the maximum voltage by the program voltage stored in the register.

According to an embodiment of the invention, the resistive random-access memory cells processed in the pilot-run procedure are selected from a plurality of pilot-run resistive random-access memory cells in a pilot-run resistive random-access memory array.

According to an embodiment of the invention, the voltage distribution comprises a mean and a standard deviation of the program voltage stored in the register, wherein the initial voltage is not less than the mean minus 0.5V and not greater than the mean plus 0.5V.

According to another embodiment of the invention, the voltage distribution comprises a mean and a standard deviation of the program voltage stored in the register, wherein the initial voltage is any voltage greater than 0V that is not less than the mean minus a predetermined multiplier of the standard deviation minus 0.3V and not greater than the mean plus 0.5V.

According to an embodiment of the invention, the maximum voltage is not less than the sum of the mean and a predetermined multiplier of the standard deviation and not greater than the sum of the mean, the predetermined multiplier of the standard deviation, and 0.5V.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
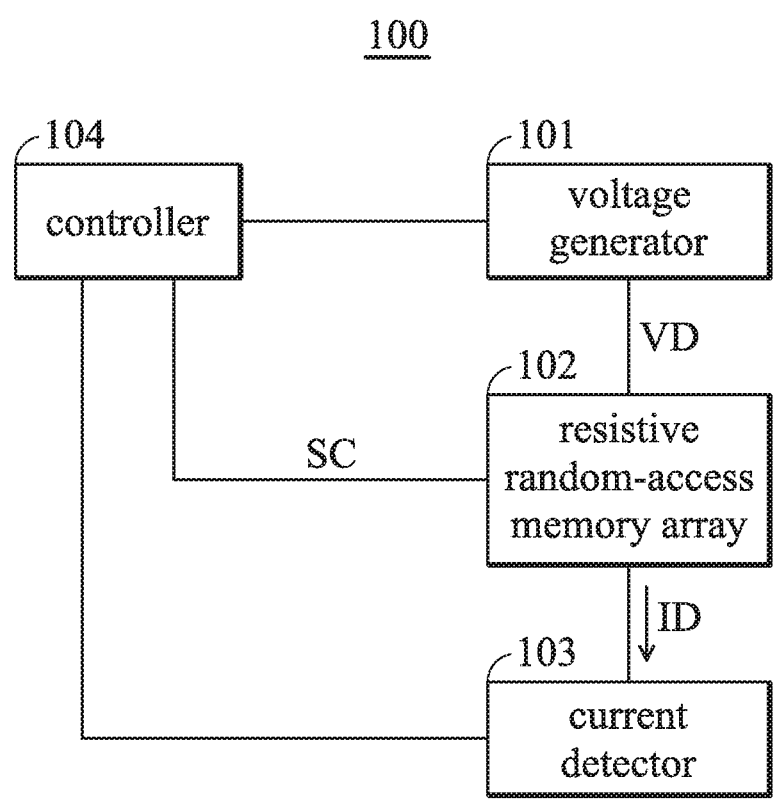
FIG. 1 is a block diagram of a memory driving device in accordance with an embodiment of the invention.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It should be understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

FIG. 1 is a block diagram of a memory driving device in accordance with an embodiment of the invention. As shown in FIG. 1, the memory driving device 100 includes the voltage generator 101, the resistive random-access memory array 102, the current detector 103, and the controller 104. The voltage generator 101 is configured to generate the program voltage VD. One of the resistive random-access memory cells in the resistive random-access memory array 102 is selected by the selection signal SC for receiving the program voltage VD to generate the program current ID. The current detector 103 is configured to detect the program current ID generated by the selected resistive random-access memory cell.

According to an embodiment of the invention, a driving procedure is executed by the controller 104 to operate a forming operation on the resistive random-access memory cells in the resistive random-access memory array 102. At the beginning of the driving procedure, the controller 104 executes a pilot-run procedure, such that a predetermined lot-size of the resistive random-access memory cells are operated in the forming operation and the required program voltages VD for the predetermined lot-size of the resistive random-access memory cells are record as a voltage distribution. For example, the required program voltages VD for the predetermined lot-size of the resistive random-access memory cells are record can be stored in a register. The steps and the corresponding description of the pilot-run procedure will be introduced in the following paragraph. According to an embodiment of the invention, the predetermined lot-size is 100 bits. According to another embodiment of the invention, the predetermined lot-size could be determined by the user according to statistical theory.

Then, according to the voltage distribution acquired from the pilot-run procedure, the controller 104 determines the initial voltage VDI and the maximum voltage VDM for operating the forming operation on the resistive random-access memory cells in the resistive random-access memory array 102, and executes the forming operation with a program voltages VD between the initial voltage VDI and the maximum voltage VDM on the resistive random-access memory cells in the resistive random-access memory array 102.

According to an embodiment of the invention, the predetermined lot-size of the resistive random-access memory cells, which have been operated in the forming operation during the pilot-run procedure, are no longer operated in the forming operation during the later stage of the driving procedure. According to an embodiment of the invention, the resistive random-access memory cells operated in the forming operation during the pilot-run procedure and the resistive random-access memory cells operated in the forming operation during the later stage of driving procedure belong to the same resistive random-access memory array 102.

According to another embodiment of the invention, the resistive random-access memory cells operated in the forming operation during the pilot-run procedure and the resistive random-access memory cells operated in the forming operation during the later stage of the driving procedure belong to different resistive random-access memory arrays. That is, the memory driving device 100 includes a pilot-run resistive random-access memory array (not shown in FIG. 1) having pilot-run resistive random-access memory cells configured to be operated in the forming operation during the pilot-run procedure, and includes the resistive random-access memory array 102 having the resistive random-access memory cells configured to be operated in the forming operation during the later stage of the driving procedure.

Figure 2:
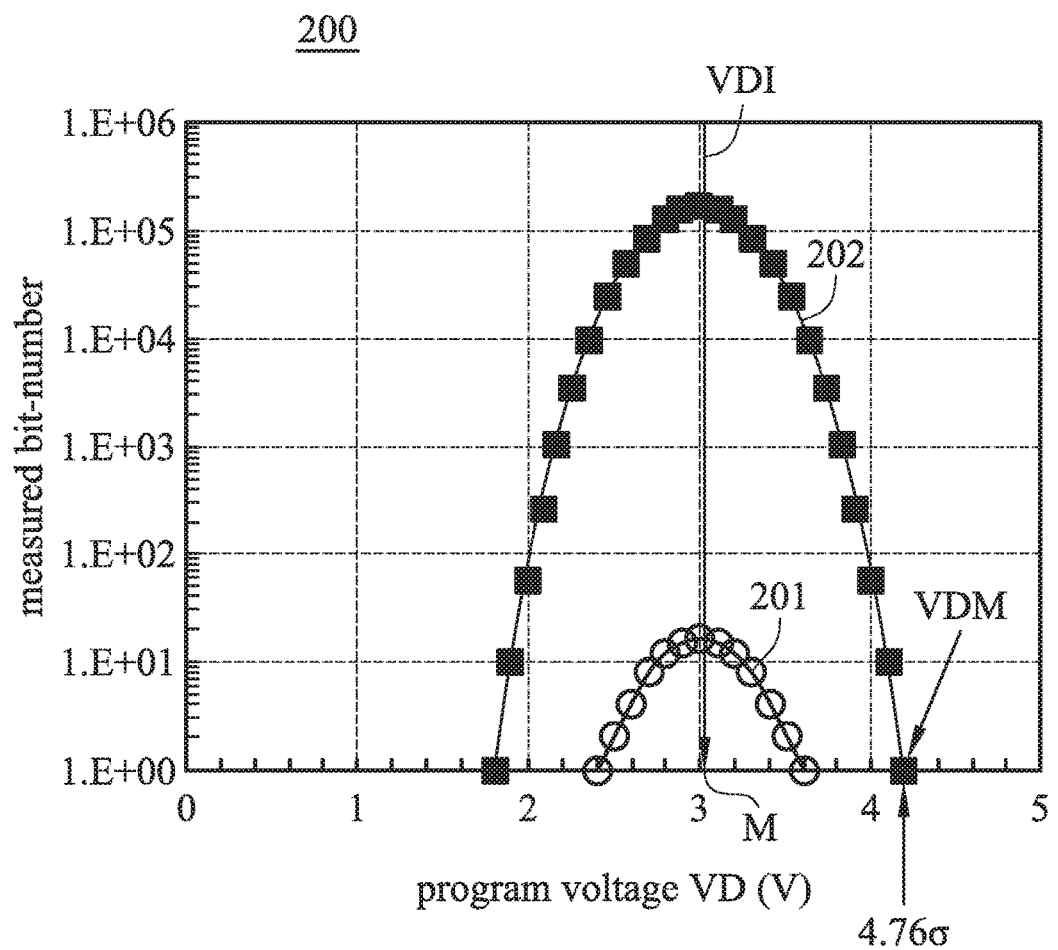
FIG. 2 is a schematic diagram of a voltage distribution in accordance with an embodiment of the invention.

FIG. 2 is a schematic diagram of a voltage distribution in accordance with an embodiment of the invention. As shown in FIG. 2, the voltage distribution 200 is a distribution of the program voltage VD vs. the measured bit-number. The first distribution curve 201 is a voltage distribution of the program voltages VD for operating the predetermined lot-size of the resistive random-access memory cells in the forming operation during the pilot-run procedure. The second distribution curve 202 is a voltage distribution of the program voltages VD for operating each of the resistive random-access memory cells in the resistive random-access memory array 102 in the forming operation during the later stage of the driving procedure.

In the embodiment, the predetermined lot-size of the pilot-run procedure is 100 bits of the resistive random-access memory cells, and 1 Mb (i.e., 1,048,576 bits) of the resistive random-access memory cells are operated in the forming operation during the later stage of the driving procedure with the program voltages VD between the initial voltage VDI and the maximum voltage VDM which are determined according to the first distribution curve 201. Since the resistive random-access memory cells corresponding to the first distribution curve 201 and those corresponding to the second distribution curve 202 come from the same population (i.e., the resistive random-access memory array 102), the voltage distribution of the second distribution curve 202 can be expected from the voltage distribution of the first distribution curve 202. For example, the mean M and the standard deviation σ of the first distribution curve 201 may be very close to the voltage distribution of the second distribution curve 202. That is, the first distribution curve 201 and the second distribution curve 202 have a similar mean M and a similar standard deviation σ. According to an embodiment of the invention, since the mean M and the standard deviation σ of the program voltages VD in the second distribution curve 202 which represents the voltage distribution of 1 Mb is derived from the pilot-run procedure, the maximum voltage VDM required in the later stage of the driving procedure may be estimated to be the sum of the mean M and 4.76 times the standard deviation σ according to the normal distribution theory with sample size of 1 Mb. The minimum voltage VDmin required in the later stage of the driving procedure may be equal to the mean M minus 4.76 times the standard deviation σ accordingly. In addition, in some embodiments of the invention, the maximum voltage VDM required in the later stage of the driving procedure may be not less than the sum of the mean M and 4.76 times the standard deviation σ and not exceed the sum of the mean M, 4.76 times the standard deviation σ, and 0.5V. The minimum voltage VDmin required in the later stage of the driving procedure exceeds 0V and is not less than the mean M minus 4.76 times the standard deviation σ and minus 0.3V. Therefore, when executing the later stage of driving procedure after the pilot-run procedure, the controller 104 selects the initial voltage VDI that is equal to the minimum voltage VDmin, fulfilling the above conditions, and it selects the maximum voltage VDM, fulfilling the above conditions for providing a wide and flexible voltage range for the program voltage VD and for preventing some of the resistive random-access memory cells from damage caused by an excessive initial voltage VDI. In addition, each of the resistive random-access memory cells in the resistive random-access memory array 102 could be ensured to be perfectly completed its forming operation.

According to an embodiment of the invention, the controller 104 may select the initial voltage VDI equal to the mean M of the first distribution curve 201 and the maximum voltage VDM equal to the sum of the mean M and 4.76 times the standard deviation σ for the later stage of the driving procedure, according to the first distribution curve 201 generated by operating the predetermined lot-size in the forming operation during the pilot-run procedure. Compared to set the initial voltage VDI equal to the minimum voltage VDmin, the driving efficiency in the embodiment could be improved to save time in the driving procedure. According to another embodiment of the invention, the designer may adjust the initial voltage VDI and the maximum voltage VDM to improve the efficiency based on his experience and other factors. For example, in some embodiments of the invention, the initial voltage VDI required in the later stage of the driving procedure may be not less than the mean M minus 0.5V and not greater than the mean M plus 0.5V. In other embodiments of the invention, the initial voltage VDI required in the driving procedure may be any value greater than 0V that is not less than the mean M minus a predetermined multiplier of the standard deviation σ minus 0.3V but not greater than the mean M plus 0.5V, in which the mean M and the standard deviation σ are obtained in the pilot-run procedure.

When the initial voltage VDI and the maximum voltage VDM are determined, the controller 104 selects one of the resistive random-access memory cells in the resistive random-access memory array 102 to execute the driving procedure for completing the forming operation of the resistive random-access memory array 102. When one of the resistive random-access memory cells in the resistive random-access memory array 102 is selected, the controller 104 controls the voltage generator 101 to gradually increase the program voltage VD from the initial voltage VDI to the maximum voltage VDM. The controller 104 also determines whether the program current ID generated by the selected resistive random-access memory cell exceeds the reference current, before the program voltage VD has been increased by a single predetermined increment.

When the program current ID generated by the selected resistive random-access memory cell exceeds the reference current, it means that the filament of the selected resistive random-access memory cell is formed and the selected resistive random-access memory cell has been transformed from the high resistance state to the low resistance state.

According to an embodiment of the invention, the reference current is set to be 1 µA. According to another embodiment of the invention, the designer may set a proper reference current as a basis to determine whether the forming operation is complete. Therefore, once the program current ID exceeds the reference current, it means that the forming operation is complete. The controller 104 then selects the next resistive random-access memory cell by the selection signal SC, in order to complete the forming operation of the whole resistive random-access memory array 102.

Figure 3A:
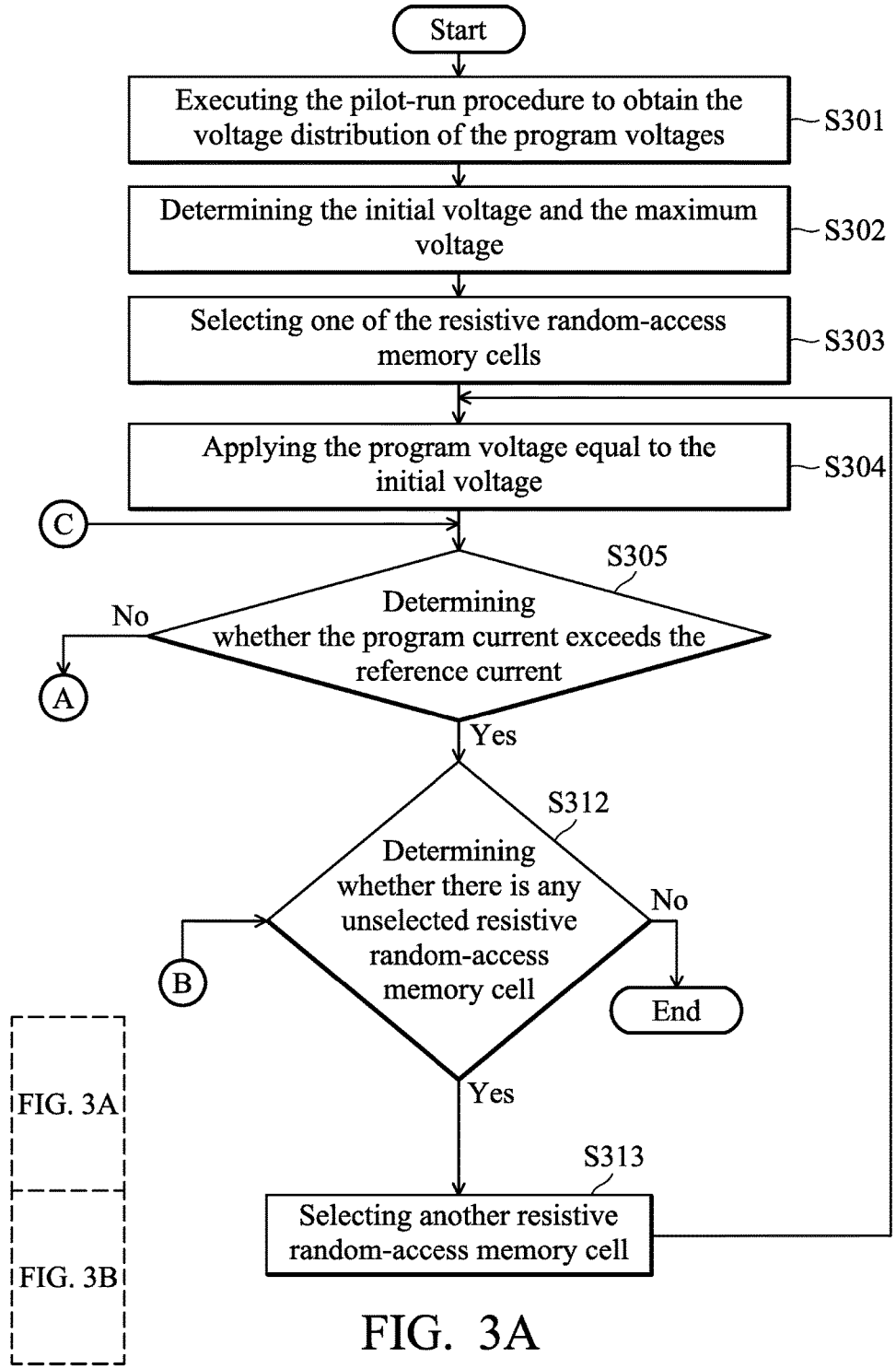
FIGS. 3A and 3B are a flow chart of the memory driving method in accordance with an embodiment of the invention.
Figure 3B:
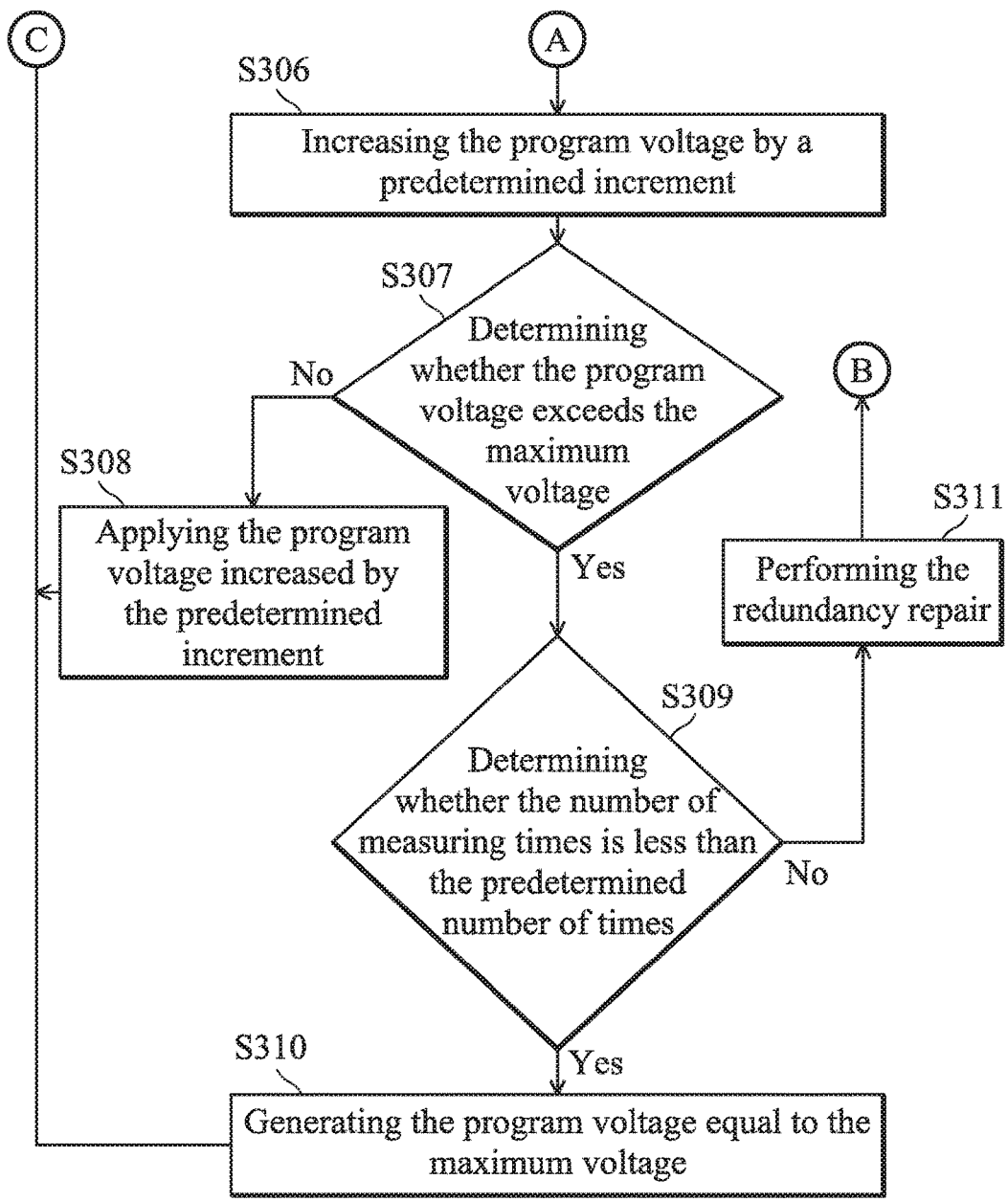

FIGS. 3A and 3B are a flow chart of the memory driving method in accordance with an embodiment of the invention. The following description of FIGS. 3A and 3B will be described by referring to FIGS. 1 and 2. First, Step S301 is executed, and the controller 104 executes the pilot-run procedure to operate a predetermined lot-size of the resistive random-access memory cells in the forming operation and records the program voltages VD required by the predetermined lot-size of the resistive random-access memory cells as a voltage distribution (the first distribution curve 201 shown in FIG. 2 for instance).

Then, the controller 104 determines the initial voltage VDI and the maximum voltage of the program voltage VD to execute the driving procedure to the resistive random-access memory array 102 (Step S302). According to an embodiment of the invention, the pilot-run procedure and the driving procedure are configured to operate the different resistive random-access memory cells in the forming operation.

When the initial voltage VDI and the maximum voltage VDM are determined, the controller 104 selects, by the selection signal SC, one of the resistive random-access memory cells in the resistive random-access memory array 102 to execute the driving procedure (Step S303). Then, the controller 104 controls the voltage generator 101 to generate the program voltage VD that is equal to the initial voltage VDI (Step S304). The controller 104 determines whether the program current ID detected by the current detector 103 exceeds the reference current (Step S305), in order to determine whether the forming operation of the selected resistive random-access memory cell is complete.

According to an embodiment of the invention, the controller 104 controls the voltage generator 101 to generate the program voltage VD in a predetermined period and stops the generation of the program voltage VD in the next predetermined period. When the generation of the program voltage VD is stopped, the current detector 103 detects the program current ID. According to an embodiment of the invention, the predetermined period may range from several microseconds to several hundreds of microseconds. According to another embodiment of the invention, the period of generating the program voltage VD is different from that of stopping the generation of the program voltage VD, and the designer could determine the period based on experience.

In Step S305, when the program current ID does not exceed the reference current, it means that the forming operation is not complete. The controller 104 then executes Step S306 to increase the program voltage VD by a predetermined increment and determines whether the program voltage VD exceeds the maximum voltage VDM (Step S307). When the program voltage VD does not exceed the maximum voltage VDM, the program voltage VD increased by the predetermined increment is generated (Step S308) and then the method returns to Step S305 for determining whether the program current ID exceeds the reference current once again. Once the program voltage VD exceeds the maximum voltage VDM, the controller 104 determines whether the number of measurements taken is less than a predetermined number of times (Step S309).

According to an embodiment of the invention, the number of measurements taken is the number of times that the controller 104 has determined whether the program current ID exceeds the reference current, that is, the number of times that the controller 104 has executed Step S305. The predetermined number of times is configured to restrict the number of times that the controller 104 executes Step S305. According to another embodiment of the invention, the number of measurements taken is the number of times that the controller 104 has determined that the program voltage VD exceeds the maximum voltage VDM. The predetermined number of times is configured to restrict the number of times that the controller 104 controls the voltage generator 101 to generate the program voltage that is equal to the maximum voltage VDM.

The method returns to Step S309, in which the controller 104 determines that the number of measurements taken is less than the predetermined number of times, and the controller 104 controls the voltage generator 102 to generate the program voltage VD that is equal to the maximum voltage VDM (Step S310). Then, the method returns to Step S305, in which the controller 104 determines whether the program current ID exceeds the reference current.

When the controller 104 determines that the number of measurements taken is not less than the predetermined number of times, the controller 104 performs a redundancy repair on the selected resistive random-access memory cell (Step S311). The redundancy repair is configured to repair the hard faults issue, which is caused by a process defect, using some additional backup memory cells and circuits, in order to improve the memory yield. Then, the controller 104 determines whether there are any unselected resistive random-access memory cells in the resistive random-access memory array 102 (Step S312). When determining there is an unselected resistive random-access memory cell in the resistive random-access memory array 102, the controller 104 selects the unselected resistive random-access memory cell by the selection signal SC (Step S313).

In Step S305, when the controller 104 determines that the program current ID exceeds the reference current, it means that the forming operation of the selected resistive random-access memory cell is complete, and the controller 104 executes Step S312 to determine whether to continue to execute the driving procedure to the next resistive random-access memory cell in the resistive random-access memory array 102 (Step S313).

Figure 4:
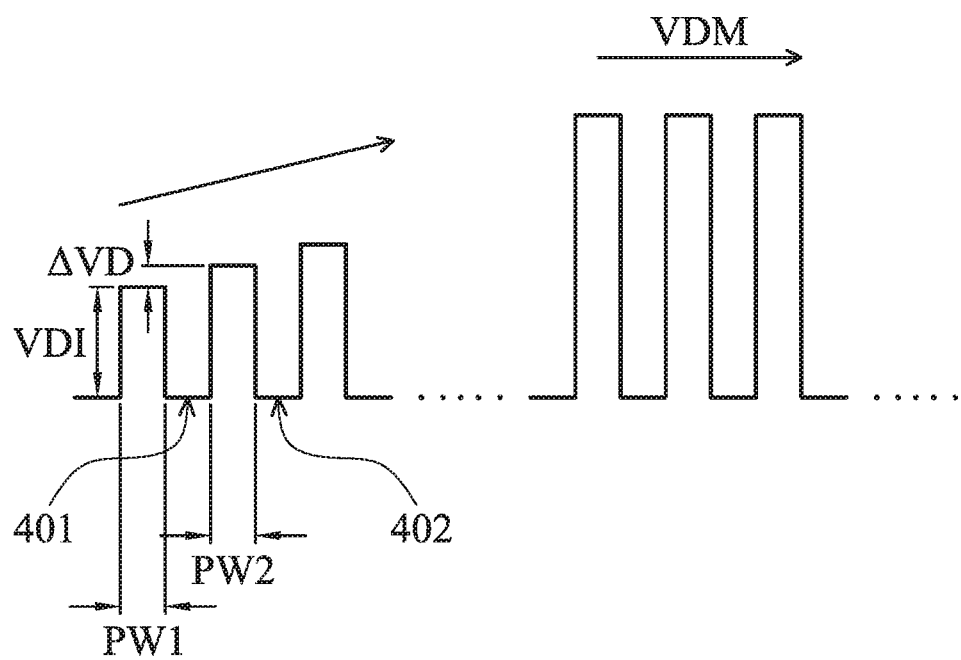
FIG. 4 is a schematic diagram of the program voltage VD in accordance with an embodiment of the invention.

FIG. 4 is a schematic diagram of the program voltage VD in accordance with an embodiment of the invention. As shown in FIG. 4, the controller 104 first controls the voltage generator 101 to generate the initial voltage VDI of the program voltage VD, in which the initial voltage VDI persists in the first predetermined period PW1. When the first predetermined period PW1 ends, the controller 104 determines whether the program current ID exceeds the reference current according to the program current ID detected by the current detector 103 in the first time slot 401.

When the program current ID does not exceed the reference current, it means that the forming operation is not complete, such that the controller 104 increases the program voltage VD by the predetermined increment $\Delta ND$ and persists in the second predetermined period PW2. When the second predetermined period PW2 ends, the controller 104 determines whether the program current ID exceeds the reference current according to the program current ID detected by the current detector 103 in the second time slot 402. According to an embodiment of the invention, the first predetermined period PW1 and the second predetermined period PW2 range from several microseconds to several hundreds of microseconds. According to another embodiment of the invention, the first predetermined period PW1 is different from the second predetermined period PW2, and the first predetermined period PW1 and the second predetermined period PW2 can be set according to the experience of the designer.

When the program voltage VD is increased by the predetermined increment $\Delta VD$, the controller 104 generates the output voltage VD equal to the maximum voltage VDM. According to an embodiment of the invention, the controller 104 controls the voltage generator 101 to generate a program voltage VD that is equal to the maximum voltage VDM for a certain number of times, in which the certain number of times is less than a predetermined number of times.

Figure 5:
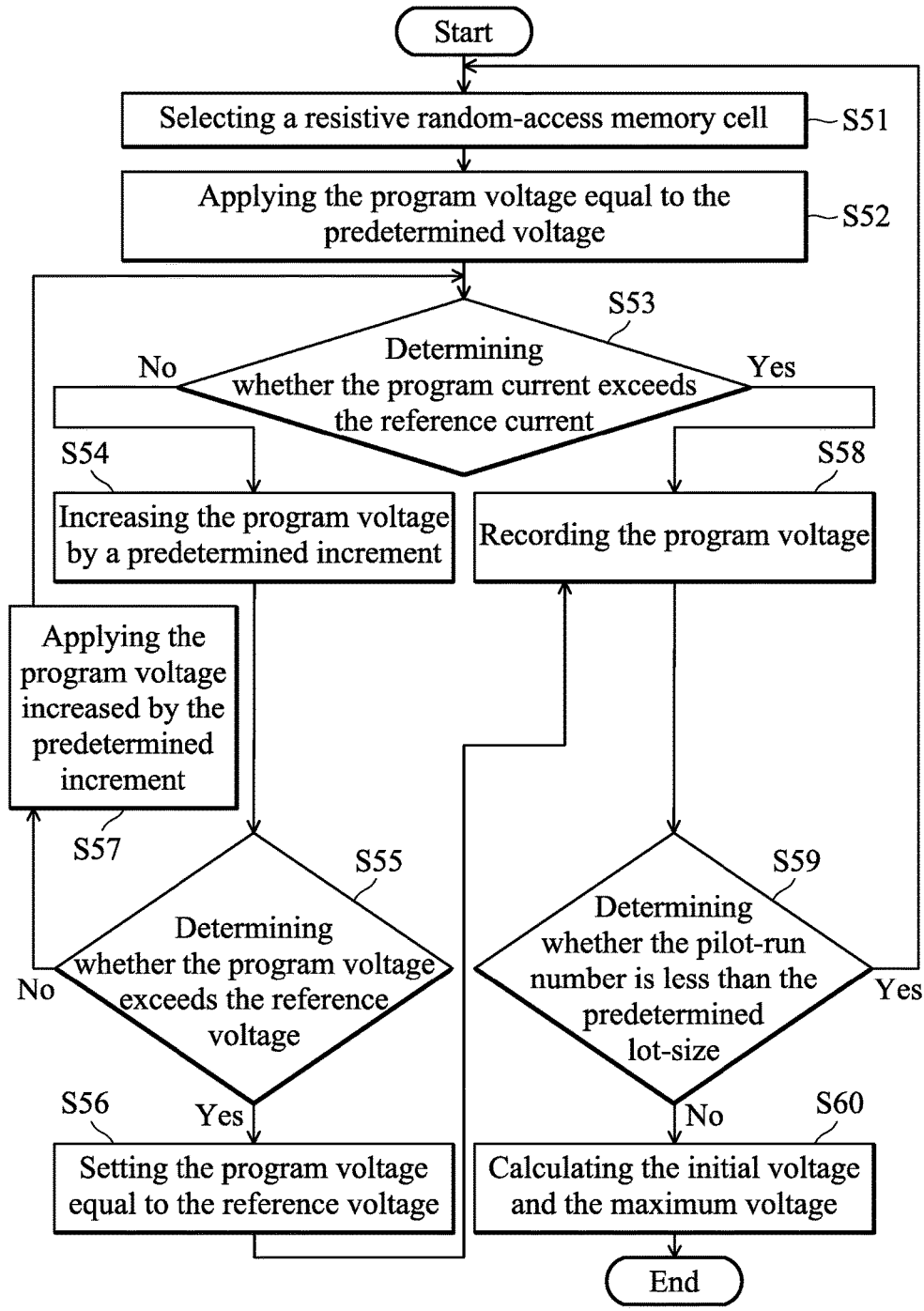
FIG. 5 is a flow chart of a pilot-run procedure in accordance with an embodiment of the invention.

In the following description, the pilot-run procedure (i.e., Step S301) and how to determine the initial voltage VDI and the maximum voltage VDM (i.e., Step S302) will be described in detail. FIG. 5 is a flow chart of a pilot-run procedure in accordance with an embodiment of the invention. The description of FIG. 5 will be described with FIGS. 1 and 2. First, the controller 104 selects a resistive random-access memory cell (Step S51) to execute the pilot-run procedure. According to an embodiment of the invention, the controller 104 executes the pilot-run procedure on one of the resistive random-access memory cells in the resistive random-access memory array 102.

According to another embodiment of the invention, the controller 104 executes the pilot-run procedure on one of the pilot-run resistive random-access memory cells in the pilot-run resistive random-access memory array (not shown in FIG. 1), in which the pilot-run resistive random-access memory array is another memory array that is different from resistive random-access memory array 102. According to another embodiment of the invention, the controller 104 executes the driving procedure to one of the resistive random-access memory cells in the resistive random-access memory array 102, which has not been processed in the pilot-run procedure.

Then, the controller 104 controls the voltage generator 101 to generate a program voltage VD that is equal to a predetermined voltage (Step S52). According to an embodiment of the invention, the predetermined voltage is 0V. According to another embodiment of the invention, the user may set the predetermined voltage for shortening the time of the pilot-run procedure. In addition, the controller 104 determines whether the program current ID exceeds the reference current according to the program current ID detected by the current detector 103, in order to determine whether the forming operation of the selected resistive random-access memory cell is complete.

According to an embodiment of the invention, the controller 104 controls the voltage generator 101 to generate a program voltage VD in a predetermined period and to stop the generation of the program voltage VD in the next predetermined period. When the generation of the program voltage VD is stopped, the current detector 103 detects the program current ID. According to an embodiment of the invention, the predetermined period may range from several microseconds to several hundreds of microseconds. According to another embodiment of the invention, the period of generating the program voltage VD is different from the period of stopping the generation of the program voltage VD, and the period length may be determined by the designer based on experience.

In Step S53, when the program current ID does not exceed the reference current, it means that the forming operation has not been completed yet. Therefore, the controller 104 enters Step S54 to increase the program voltage VD by a predetermined increment. The controller 104 further determines whether the program voltage VD exceeds the reference voltage (Step S55). When the program voltage VD exceeds the reference voltage, the controller 104 sets the program voltage VD equal to the reference voltage (Step S56), and the controller 104 then executes Step S58 to record the program voltage VD. When the program voltage VD does not exceed the reference voltage, the controller 104 executes Step S57 to provide a program voltage VD that is increased by a predetermined increment for the selected resistive random-access memory cell, and then Step S53 is performed.

In Step S53, when the controller 104 determines that the program current ID exceeds the reference current, it means that the forming operation of the selected resistive random-access memory cell is complete. Therefore, the controller 104 executes Step S58 to record the program voltage VD that successfully completes the forming operation.

In addition, the controller 104 determines whether the pilot-run number is less than the predetermined lot-size (Step S59). According to an embodiment of the invention, the predetermined lot-size is 100 bits. According to another embodiment of the invention, the user may set the predetermined lot-size, such that the sample size of the predetermined lot-size is so large that the voltage distribution of the program voltage VD may represent the characteristics of all the resistive random-access memory cells.

When determining that the pilot-run number is less than the predetermined lot-size, Step S51 is performed again and the controller 104 selects the next resistive random-access memory cell; when determining that the pilot-run number is not less than the predetermined lot-size, the controller 104 calculates the initial voltage VDI and the maximum voltage VDM of the program voltage VD according to the first distribution curve 201 obtained by the pilot-run procedure (Step S60).

According to an embodiment of the invention, the pilot-run procedure shown in FIG. 5 is configured to discover the exact program voltage VD of each of the resistive random-access memory cells in the predetermined lot-size to obtain the first distribution curve 201 shown in FIG. 2. According to an embodiment of the invention, the controller 104 determines the initial voltage VDI of the later stage of the driving procedure by the mean M of the first distribution curve 201 and determines the maximum voltage VDM of the later stage of the driving procedure equal to the sum of the mean M and 4.76 times the standard deviation σ of the first distribution curve 201. According to another embodiment of the invention, the controller 104 selects the initial voltage VDI equal to the mean M minus 4.76 times the standard deviation σ for executing the later stage of the driving procedure. According to yet another embodiment of the invention, the designer may adjust or select the initial voltage VDI and the maximum voltage VDM based on his experience and other factors for better productivity.

Since the forming voltages among the resistive random-access memory cells are distributed widely, the issue of over-forming may be caused by forming all the resistive random-access memory cells with a fixed voltage. According to the memory driving devices and methods disclosed in the invention, the proper program voltage VD may be adaptively selected for each of the resistive random-access memory cells, such that the issue of over-forming could be significantly reduced.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:
1. A memory driving device for a resistive random-access memory array, wherein the resistive random-access memory array comprises a plurality of resistive random-access memory cells, the memory driving device comprising:
 a voltage generator, generating a program voltage, wherein one of the resistive random-access memory cells receives the program voltage to generate a program current;
 a current detector, detecting the program current; and
 a controller, executing a driving procedure, wherein the driving procedure comprises:
  executing a pilot-run procedure to obtain a voltage distribution of the program voltages;
  determining an initial voltage and a maximum voltage of the program voltage according to the voltage distribution;
  selecting one of the resistive random-access memory cells by a selection signal;
  applying the program voltage to the selected resistive random-access memory cell, wherein the program voltage ranges from the initial voltage to the maximum voltage;
  determining whether the program current exceeds a reference current; and
  when the program current exceeds the reference current, selecting another resistive random-access memory cell in the resistive random-access memory array by the selection signal.

2. The memory driving device in claim 1, wherein the program voltage is gradually increased from the initial voltage and applied to the selected resistive random-access memory cell, wherein when the program current does not exceed the reference current, the driving procedure further comprises:
increasing the program voltage;
determining whether the program voltage exceeds the maximum voltage;
when the program voltage does not exceed the maximum voltage, generating the increased program voltage and determining whether the program current exceeds the reference current;
when the program voltage exceeds the maximum voltage, determining whether a number of measurements taken is less than a predetermined number of times, wherein the number of measurements taken is a number of times of determining whether the program current exceeds the reference current;
when determining that the number of measurements taken is less than the predetermined number of times, generating the program voltage equal to the maximum voltage; and
when determining that the number of measurements taken is not less than the predetermined number of times, performing a redundancy repair.

3. The memory driving device of claim 1, wherein when the program current exceeds the reference current, the driving procedure further comprises:
determining whether there is another resistive random-access memory cell that is unselected in the resistive random-access memory array;
when there is another resistive random-access memory cell that is unselected in the resistive random-access memory array, selecting, by the selection signal, the other resistive random-access memory cell that is unselected; and
applying the program voltage that is equal to the initial voltage to the another resistive random-access memory cell.

4. The memory driving device of claim 1, wherein the pilot-run procedure comprises:
selecting one of the resistive random-access memory cells by the selection signal;
generating the program voltage to the selected resistive random-access memory cell by the voltage generator, wherein the program voltage is a predetermined voltage;
determining whether the program current exceeds the reference current;
when the program current does not exceed the reference current, increasing the program voltage by a predetermined increment and determining whether the program voltage increased by the predetermined increment exceeds a reference voltage; and
when the program voltage increased by the predetermined increment does not exceed the reference voltage, generating the program voltage that is increased by the predetermined increment and applying the program voltage to the selected resistive random-access memory cell.

5. The memory driving device of claim 4, wherein the pilot-run procedure further comprises:

when the program current exceeds the reference current, storing the program voltage corresponding to the program current in a register to form the voltage distribution;
determining whether a number of measurements taken of the selected resistive random-access memory cells is less than a predetermined lot-size;
when the number of measurements taken is less than the predetermined lot-size, selecting, by the selection signal, another resistive random-access memory cell that is unselected;
when the number of measurements taken is not less than the predetermined lot-size, calculating the initial voltage and the maximum voltage by the program voltages stored in the register.

6. The memory driving device of claim 5, further comprising a pilot-run resistive random-access memory array, wherein the pilot-run resistive random-access memory array comprises a plurality of pilot-run resistive random-access memory cells, wherein the resistive random-access memory cells processed in the pilot-run procedure are selected from the pilot-run resistive random-access memory cells.

7. The memory driving device of claim 1, wherein the voltage distribution comprises a mean and a standard deviation of the program voltages stored in a register, wherein the initial voltage is not less than the mean minus 0.5V and not greater than the mean plus 0.5V.

8. The memory driving device of claim 1, wherein the voltage distribution comprises a mean and a standard deviation of the program voltages stored in a register, wherein the initial voltage is any voltage greater than 0V that is not less than the mean minus a predetermined multiplier of the standard deviation minus 0.3V and not greater than the mean plus 0.5V.

9. The memory driving device of claim 7, wherein the maximum voltage is not less than a sum of the mean and a predetermined multiplier of the standard deviation and not greater than a sum of the mean, the predetermined multiplier of the standard deviation, and 0.5V.

10. A memory driving method for selecting a resistive random-access memory cell in a resistive random-access memory array and applying a program voltage to the resistive random-access memory cell to generate a program current, comprising:
executing a pilot-run procedure to obtain a voltage distribution of the program voltages;
determining an initial voltage and a maximum voltage of the program voltage according to the voltage distribution;
selecting one of the resistive random-access memory cells;
applying the program voltage to the selected resistive random-access memory cell, wherein the program voltage is between the initial voltage and the maximum voltage;
determining whether the program current exceeds a reference current; and
when the program current exceeds the reference current, selecting another resistive random-access memory cell.

11. The memory driving method of claim 10, wherein the program voltage is gradually increased from the initial voltage and applied to the selected resistive random-access memory cell, wherein when the program current does not exceed the reference current, the driving procedure further comprises:
increasing the program voltage;

determining whether the program voltage exceeds the maximum voltage;

generating the increased program voltage and determining whether the program current exceeds the reference current when the program voltage does not exceed the maximum voltage;

determining whether a number of measurements taken is less than a predetermined number of times when the program voltage exceeds the maximum voltage, wherein the number of measurements taken is a number of times of determining whether the program current exceeds the reference current;

generating the program voltage that is equal to the maximum voltage when determining that the number of measurements taken is less than the predetermined number of times; and performing a redundancy repair when determining that the number of measurements taken is not less than the predetermined number of times.

12. The memory driving method of claim 10, wherein when the program current exceeds the reference current, the driving procedure further comprises:

determining whether there is another resistive random-access memory cell that is unselected in the resistive random-access memory array;

when there is another resistive random-access memory cell that is unselected in the resistive random-access memory array, selecting the other resistive random-access memory cell that is unselected; and generating the program voltage that is equal to the initial voltage.

13. The memory driving method of claim 10, wherein the pilot-run procedure comprises:

selecting one of the resistive random-access memory cells;

applying the program voltage to the selected resistive random-access memory cell, wherein the program voltage is a predetermined voltage;

determining whether the program current exceeds the reference current;

when the program current does not exceed the reference current, increasing the program voltage by a predetermined increment and determining whether the program voltage increased by the predetermined increment exceeds a reference voltage; and when the program voltage increased by the predetermined increment does not exceed the reference voltage, generating the program voltage that is increased by the predetermined increment and applying the program voltage to the selected resistive random-access memory cell.

14. The memory driving method of claim 13, wherein the pilot-run procedure further comprises:

when the program current exceeds the reference current, storing the corresponding program voltage in a register to form the voltage distribution;

determining that a number of measurements taken of the selected resistive random-access memory cells is less than a predetermined lot-size;

when the number of measurements taken is less than the predetermined lot-size, selecting another resistive random-access memory cell by the selection signal;

when the number of measurements taken is not less than the predetermined lot-size, calculating the initial voltage and the maximum voltage by the program voltage stored in the register.

15. The memory driving method of claim 14, wherein the resistive random-access memory cells processed in the pilot-run procedure are selected from a plurality of pilot-run resistive random-access memory cells in a pilot-run resistive random-access memory array.

16. The memory driving method of claim 10, wherein the voltage distribution comprises a mean and a standard deviation of the program voltages stored in the register, wherein the initial voltage is not less than the mean minus 0.5V and not greater than the mean plus 0.5V.

17. The memory driving method of claim 10, wherein the voltage distribution comprises a mean and a standard deviation of the program voltage stored in the register, wherein the initial voltage is any voltage greater than 0V that is not less than the mean minus a predetermined multiplier of the standard deviation minus 0.3V and not greater than the mean plus 0.5V.

18. The memory driving method of claim 17, wherein the maximum voltage is not less than the sum of the mean and a predetermined multiplier of the standard deviation and not greater than the sum of the mean, the predetermined multiplier of the standard deviation, and 0.5V.

* * * * *